(12) United States Patent
Hong et al.

(10) Patent No.: US 12,205,978 B2
(45) Date of Patent: Jan. 21, 2025

(54) LIGHT EMITTING DIODE UNIT

(71) Applicant: Seoul Semiconductor Co., Ltd., Ansan-si (KR)

(72) Inventors: Seung Sik Hong, Ansan-si (KR); Hyuck Jun Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 36 days.

(21) Appl. No.: 17/691,540

(22) Filed: Mar. 10, 2022

(65) Prior Publication Data

US 2022/0199684 A1    Jun. 23, 2022

Related U.S. Application Data

(63) Continuation of application No. 16/482,886, filed as application No. PCT/KR2018/001367 on Feb. 1, 2018, now Pat. No. 11,302,744.

(30) Foreign Application Priority Data

Feb. 2, 2017    (KR) .................. 10-2017-0014865

(51) Int. Cl.
    *H01L 27/15*    (2006.01)
    *H01L 33/50*    (2010.01)
    *H01L 33/58*    (2010.01)

(52) U.S. Cl.
    CPC ............ *H01L 27/156* (2013.01); *H01L 33/50* (2013.01); *H01L 33/58* (2013.01)

(58) Field of Classification Search
    CPC ........ H01L 27/156; H01L 33/50; H01L 33/58
    See application file for complete search history.

(56) References Cited

U.S. PATENT DOCUMENTS

| 6,744,077 B2 | 6/2004 | Trottier et al. |
| 9,236,539 B2 | 1/2016 | Yang et al. |
| 9,490,398 B2 | 11/2016 | Oyamada et al. |

(Continued)

FOREIGN PATENT DOCUMENTS

| CN | 102064171 | 5/2011 |
| CN | 103453352 | 12/2013 |

(Continued)

OTHER PUBLICATIONS

Office Action issued for corresponding Chinese Patent Application No. 201880005631.9 (with English Concise Explanation).

(Continued)

*Primary Examiner* — Jay C Chang
*Assistant Examiner* — Mikka Liu
(74) *Attorney, Agent, or Firm* — Oblon, McClelland, Maier & Neustadt, L.L.P.

(57) ABSTRACT

A light emitting diode device including a substrate, a plurality of terminals disposed on the substrate, and a plurality of light sources disposed on the substrate, electrically connected to the plurality of terminals, and configured to emit light, in which each of the light sources includes a light emitting diode chip, and a wall surrounding side surfaces of the light emitting diode chip, at least one of the light sources includes a wavelength converter disposed on the light emitting diode chip, and at least two light sources share the wall.

19 Claims, 10 Drawing Sheets

(56) References Cited

U.S. PATENT DOCUMENTS

| | | | |
|---|---|---|---|
| 9,890,930 | B2 | 2/2018 | Tien et al. |
| 10,236,421 | B2 | 3/2019 | Jung et al. |
| 10,784,415 | B2 | 9/2020 | Jung et al. |
| 10,971,662 | B2 | 4/2021 | Cho et al. |
| 2007/0114559 | A1 | 5/2007 | Sayer et al. |
| 2009/0294780 | A1* | 12/2009 | Chou ............... H05B 33/12 |
| | | | 257/E33.061 |
| 2011/0254039 | A1 | 10/2011 | Kim et al. |
| 2014/0319553 | A1 | 10/2014 | Ye et al. |
| 2014/0339495 | A1* | 11/2014 | Bibl ............... H01L 33/502 |
| | | | 257/13 |
| 2015/0362165 | A1 | 12/2015 | Chu et al. |
| 2017/0133357 | A1 | 5/2017 | Kuo et al. |
| 2018/0151543 | A1* | 5/2018 | Lee ............... H01L 33/32 |

FOREIGN PATENT DOCUMENTS

| | | |
|---|---|---|
| CN | 103872226 | 6/2014 |
| CN | 104854716 | 8/2015 |
| CN | 105378952 | 3/2016 |
| CN | 106058006 | 10/2016 |
| CN | 106257695 | 12/2016 |
| KR | 2011-0078482 | 7/2011 |
| KR | 10-2011-0115506 | 10/2011 |
| KR | 10-2013-0017067 | 2/2013 |
| KR | 10-2013-0022595 | 3/2013 |
| KR | 10-2017-0000512 | 1/2017 |
| TW | 200421683 | 10/2004 |

OTHER PUBLICATIONS

Chinese Office Action dated Aug. 29, 2022, in Chinese Patent Application No. 201880005631.9 (with English Concise Explanation).

International Search Report mailed May 14, 2018, in International Application No. PCT/KR2018/001367 (with English Translation).

Non-Final Office Action issued Jul. 9, 2021, in U.S. Appl. No. 16/482,886.

Notice of Allowance issued Dec. 9, 2021, in U.S. Appl. No. 16/482,886.

Office Action dated Oct. 30, 2023, issued to Korean Patent Application No. 10-2017-0014865 (with English Translation).

* cited by examiner

LIGHT EMITTING DIODE UNIT

CROSS-REFERENCE TO RELATED APPLICATIONS

This application is a continuation of U.S. application Ser. No. 16/482,886, filed on Aug. 1, 2019, which is a National Sage Entry of International Patent Application No. PCT/KR2018/001367, filed on Feb. 1, 2018, and claims priority from and the benefit of Korean Patent Application No. 10-2017-0014865, filed on Feb. 2, 2017, each of which are hereby incorporated by reference for all purposes as set forth herein.

BACKGROUND

Field

Exemplary embodiments of the present disclosure relate to a light emitting diode unit, and more particularly, to a light emitting diode unit emitting white light using a plurality of light emitting diode chips.

Discussion of the Background

A light emitting diode is an inorganic semiconductor device which emits light generated by recombination of electrons and holes. In recent years, light emitting diodes have been widely used in various fields, such as display devices, vehicular lamps, general lighting, and the like. With advantages such as longer lifespan, lower power consumption, and quicker response, light emitting diodes have been rapidly replacing existing light sources in the art.

There are various methods for displaying white light using a light emitting diode, such as using a blue light emitting diode emitting blue light, a red light emitting diode emitting red light, and a green light emitting diode emitting green light.

FIGS. 1A through 1C are views illustrating conventional light emitting diode units. The light emitting diode units shown in FIGS. 1A to 1C includes the light emitting diodes 22, 24 and 26, which emit blue light, red light, and green light, respectively.

As shown in FIG. 1A, the blue light emitting diode 22, the red light emitting diode 24, and the green light emitting diode 26 may be used without wavelength conversion. In this case, however, the red light emitting diode 24 may be difficult to manufacture due to its high manufacturing cost and low yield. Accordingly, instead of the red light emitting diode 24, the blue light emitting diode 22 may be used to display red light.

FIG. 1B is a view illustrating wavelength conversion of a blue light emitting diode 22a to emit red light. More particularly, a red wavelength converter 50 is disposed to cover the blue light emitting diode 22a. The red wavelength converter 50 may include one or more types of phosphors therein to convert a wavelength of blue light emitted from the blue light emitting diode 22a so as to emit red light to the outside.

Further, in some conventional light emitting diode units, the green light emitting diode 26 may not be used. FIG. 1C is a view illustrating the emission of blue light, red light, and green light by using the blue light emitting diodes 22 and 22a. More particularly, a green wavelength converter 52 is disposed to cover the blue light emitting diode 22a to emit green light. The green wavelength converter 52 may include one or more types of phosphors to convert a wavelength of blue light emitted from the blue light emitting diode 22a so as to emit green light to the outside.

However, since the conventional light emitting diode unit shown in FIGS. 1A, 1B, or 1C emits light to an upper surface and side surfaces of each light emitting diode, it is difficult to display mixed light emitted from each light emitting diode into a desired color.

The above information disclosed in this Background section is only for understanding of the background of the inventive concepts, and, therefore, it may contain information that does not constitute prior art.

SUMMARY

Exemplary embodiments of the present disclosure provide a light emitting diode unit capable of easily adjusting a color balance by mixing light emitted from each light emitting diode.

A light emitting diode unit according to an exemplary embodiment includes a blue light emitting diode package disposed on a substrate and configured to emit blue light to the outside, a red light emitting diode package disposed on the substrate and configured to emit red light to the outside, and a green light emitting diode package disposed on the substrate and configured to emit green light to the outside, in which each of the blue light emitting diode package, the red light emitting diode package, and the green light emitting diode package includes a wall to prevent light from being emitted to the sides thereof The blue light emitting diode package may include a blue light emitting diode chip, a first transparent portion disposed over the blue light emitting diode chip, and a first wall surrounding side surfaces of the blue light emitting diode chip, and the green light emitting diode package may include a green light emitting diode chip, a second transparent portion disposed over the green light emitting diode chip, and a second wall surrounding side surfaces of the green light emitting diode chip.

The red light emitting diode package may include a red light emitting diode chip, a third transparent portion disposed over the red light emitting diode chip, and a third wall surrounding side surfaces of the red light emitting diode chip.

The blue light emitting diode chip included in the blue light emitting diode package may include a first blue light emitting diode chip, and the red light emitting diode package may include a second blue light emitting diode chip, a wavelength converter disposed to cover the second blue light emitting diode chip, and configured to convert a wavelength of blue light emitted from the second blue light emitting diode chip to emit red light, a color filter disposed to cover the wavelength converter, and configured to block blue light from being emitted from the wavelength converter, and a third wall disposed to surround side surfaces of the color filter.

The first wall and the third wall may be extended as a single wall, and the blue light emitting diode package and the red light emitting diode package may be surrounded by the single wall.

The first wall and the second wall may be extended as a single wall, and the blue light emitting diode package and the green light emitting diode package may be surrounded by the single wall.

The blue light emitting diode package, the red light emitting diode package, and the green light emitting diode package may be spaced apart from one another.

The blue light emitting diode package, the red light emitting diode package, and the green light emitting diode package may further include a black second wall surrounding side surfaces of the wall, respectively.

The blue light emitting diode package may include a blue light emitting diode chip, a first wall surrounding side surfaces of the blue light emitting diode chip, and a first transparent portion disposed over the blue light emitting diode chip and the first wall, and wherein the green light emitting diode package may include a green light emitting diode chip, a second wall surrounding side surfaces of the green light emitting diode chip, and a second transparent portion disposed over the green light emitting diode chip and the second wall.

The red light emitting diode package may include a red light emitting diode chip, a third wall surrounding side surfaces of the red light emitting diode chip, and a third transparent portion disposed over the red light emitting diode chip and the third wall.

The red light emitting diode package may include a blue light emitting diode chip, a third wall disposed to surround side surfaces of the blue light emitting diode chip, a wavelength converter disposed to cover upper portions of the blue light emitting diode chip and the third wall, and configured to convert a wavelength of blue light emitted from the blue light emitting diode chip to emit red light, and a color filter disposed to cover the wavelength converter and configured to block blue light from being emitted from the wavelength converter.

The first wall and the second wall may be extended as a single wall, and the blue light emitting diode package and the green light emitting diode package may be surrounded by the single wall.

The blue light emitting diode package, the red light emitting diode package, and the green light emitting diode package may further include a black fourth wall surrounding side surfaces of the wall, respectively.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1A:
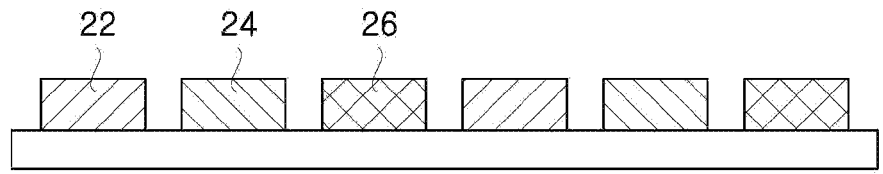
FIGS. 1A, 1B, and 1C are view illustrating conventional light emitting diode units.
Figure 1B:
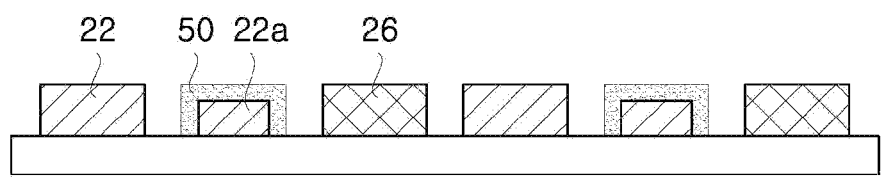
Figure 1C:
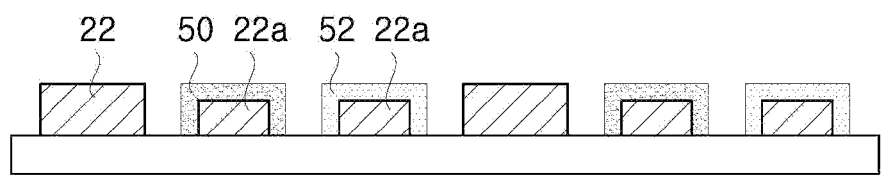

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
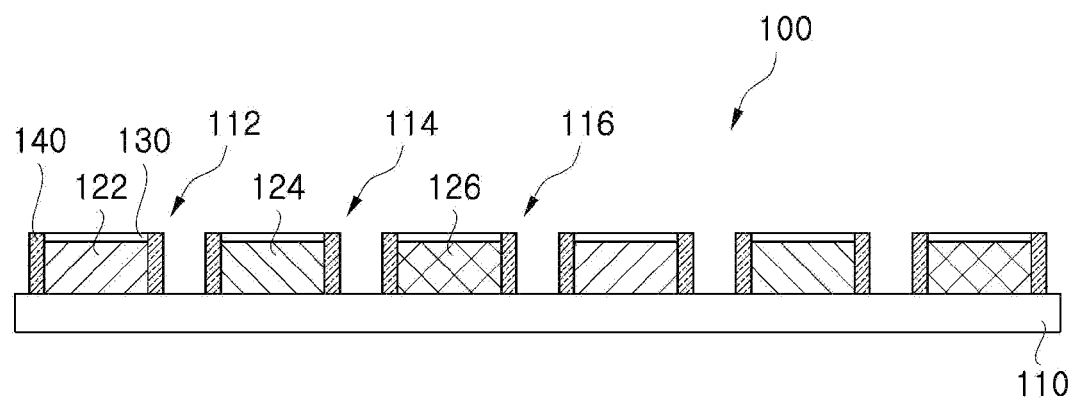
FIG. 2 is a cross-sectional view of a light emitting diode unit according to a first exemplary embodiment of the present disclosure.

FIG. 2 is a cross-sectional view of a light emitting diode unit according to a first exemplary embodiment of the present disclosure.

Referring to FIG. 2, a light emitting diode unit 100 according to the first exemplary embodiment of the present disclosure includes a substrate 110, a blue light emitting diode package 112, a red light emitting diode package 114, and a green light emitting diode package 116.

The substrate 110 may be provided to support each light emitting diode package, and a plurality of light emitting diode packages may be disposed on the substrate 110. A plurality of terminals may be provided on the substrate 110 to be electrically connected to the respective light emitting diode packages, and external power may be supplied to the respective light emitting diode packages through the plurality of terminals.

In the illustrated exemplary embodiment, the blue light emitting diode package 112, the red light emitting diode package 114, and the green light emitting diode package 116 are sequentially disposed on the substrate 110, but the sequence of the light emitting diode packages may be changed if necessary.

The blue light emitting diode package 112, the red light emitting diode package 114, and the green light emitting diode package 116 include a first blue light emitting diode chip 122, a red light emitting diode chip 124, and a green light emitting diode chip 126, respectively. The blue light emitting diode package 112, the red light emitting diode package 114, and the green light emitting diode package 116 may further include a transparent portion 130 and a first wall 140, respectively.

In this case, each of the first blue light emitting diode chip 122, the red light emitting diode chip 124, and the green light emitting diode chip 126 may include a light emitting structure including an n-type semiconductor layer, an active layer, and a p type semiconductor layer.

The n-type semiconductor layer, the active layer, and the p-type semiconductor layer may each include a III-V compound semiconductor, and may include a nitride semiconductor, such as (Al, Ga, In)N.

The n-type semiconductor layer may be a conductive semiconductor layer including an n-type impurity (for example, Si), and the p-type semiconductor layer may be a conductive semiconductor layer including a p-type impurity (for example, Mg). The active layer may be interposed between the n-type semiconductor layer and the p-type semiconductor layer, and may include a multiple quantum well structure (MQW). A composition ratio of the active layer may be determined to emit light having a desired peak wavelength.

In the illustrated exemplary embodiment, the first blue light emitting diode chip 122, the red light emitting diode chip 124, and the green light emitting diode chip 126 may have a flip chip shape, respectively. More particularly, each of the first blue light emitting diode chip 122, the red light emitting diode chip 124, and the green light emitting diode chip 126 may be provided with an n-type electrode pad and a p-type electrode pad under the light emitting structure. In this case, the n-type electrode pad may be electrically connected to the n-type semiconductor layer, and the p-type electrode pad may be electrically connected to the p-type semiconductor layer.

In the illustrated exemplary embodiment, since the blue light emitting diode package 112, the red light emitting diode package 114, and the green light emitting diode package 116 have the same structure, hereinafter, the blue light emitting diode package 112 will be exemplarily described in more detail.

The blue light emitting diode package 112 includes the first blue light emitting diode chip 122, the transparent portion 130, and the first wall 140.

The first blue light emitting diode chip 122 is disposed on the substrate 110, and the transparent portion 130 is disposed over the first blue light emitting diode chip 122. The transparent portion 130 may include a transparent material to transmit light emitted from the first blue light emitting diode chip 122, and may additionally include silicone, epoxy, or the like. The transparent portion 130 may prevent the first blue light emitting diode chip 122 from being directly exposed to the outside.

The first wall 140 may be disposed to surround side surfaces of the first blue light emitting diode chip 122 and the transparent portion 130. The first wall 140 may contact the side surfaces of the first blue light emitting diode chip 122 and the transparent portion 130, and may include a material having low light loss and high reflectivity.

Since the transparent portion 130 and the first wall 140 are disposed as described above, light generated from the first blue light emitting diode chip 122 may be emitted to the outside in an upward direction through the transparent portion 130, and light emitted in a horizontal direction may be reflected by the first wall 140 disposed on the side surfaces and be emitted in the upward direction.

The red light emitting diode package 114 includes the red light emitting diode chip 124, the transparent portion 130, and the first wall 140, and the green light emitting diode package 116 includes the green light emitting diode chip 126, the transparent portion 130, and the first wall 140. A structure of the red light emitting diode package 114 and the green light emitting diode package 116 are the same as that of the blue light emitting diode package 112, and thus, repeated descriptions thereof will be omitted to avoid redundancy.

FIGS. 3A through 3E are views illustrating a method of manufacturing a light emitting diode package included in the light emitting diode unit according to the first exemplary embodiment of the present disclosure.

Referring to FIGS. 3A through 3E, a method of manufacturing the blue light emitting diode package 112 will be described as an example. Methods of manufacturing the red light emitting diode package 114 and the green light emitting diode package 116 are substantially the same as that of the blue light emitting diode package 112, and thus, repeated descriptions thereof will be omitted.

Figure 3A:
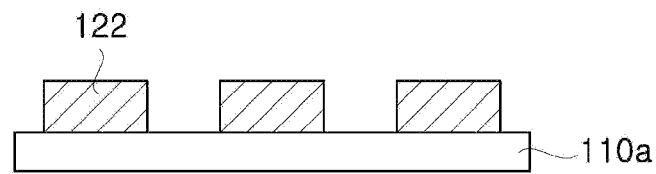
FIGS. 3A, 3B, 3C, 3D, and 3E are views illustrating a method of manufacturing a light emitting diode package included in the light emitting diode unit according to the first exemplary embodiment of the present disclosure.
Figure 3B:
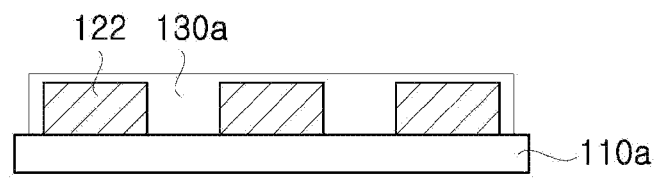
Figure 3C:
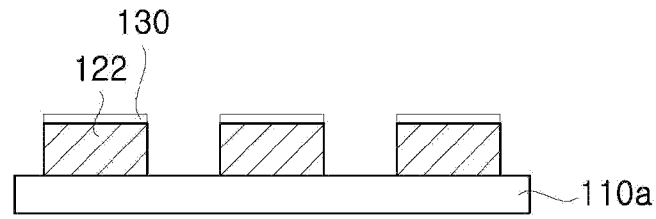

Referring to FIG. 3A, the first blue light emitting diode chips 122 are disposed on a manufacturing substrate 110a and are spaced apart from one another at a predetermined interval. Then, as shown in FIG. 3B, a transparent material 130a is applied to cover the entire first blue light emitting diode chip 122 disposed on the manufacturing substrate 110a. The transparent material 130a may be silicone, epoxy, or the like, and may be in the form of a liquid having a high viscosity. After the applied transparent material 130a is cured, the transparent material 130a located between the light emitting diode chips 122 is removed through a dicing process or the like for each light emitting diode chip 122. After the dicing process, the transparent material 130a remaining on the light emitting diode chip 122 is grinded to form the transparent portion 130 on the light emitting diode chip 122, as shown in FIG. 3C.

Figure 3D:
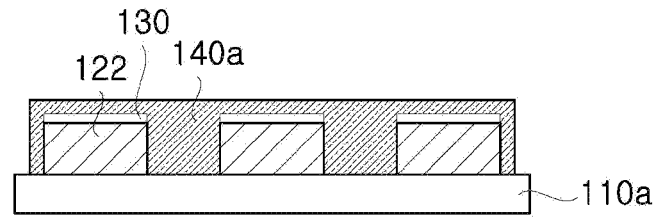

When the transparent portion 130 is formed on the light emitting diode chip 122, a wall material 140a for forming the first wall 140 is applied, as shown in FIG. 3D. The wall material 140a may be a material having low light loss and high reflectivity, and may be formed by a dotting or printing process. In this case, the wall material 140a may be formed to cover an upper surface and the entire side surfaces of the light emitting diode chip 122 on which the transparent portion 130 is disposed.

Figure 3E:
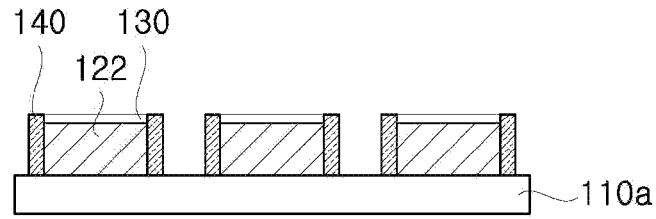

When the wall material 140a is cured, each light emitting diode chip 122 may be separated through a dicing process or the like, and the first wall 140 may be formed in accordance with an elevation of the transparent portion 130 by grinding the upper surface thereof Through this process, the first wall 140 may be disposed to have a predetermined thickness so as to be in contact with the side surfaces of the light emitting diode chip 122 and the transparent portion 130, as shown in FIG. 3E.

Figure 4:
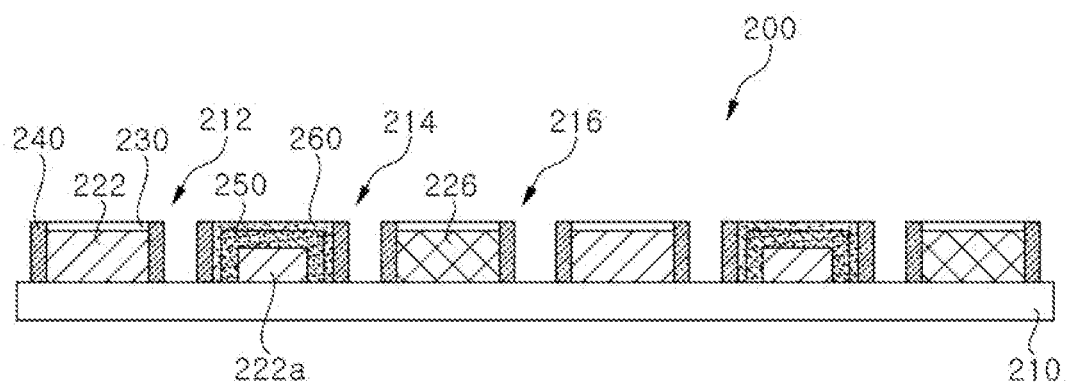
FIG. 4 is a cross-sectional view of a light emitting diode unit according to a second exemplary embodiment of the present disclosure.

FIG. 4 is a cross-sectional view illustrating a light emitting diode unit according to a second exemplary embodiment of the present disclosure.

Referring to FIG. 4, a light emitting diode unit 200 according to the second exemplary embodiment of the present disclosure includes the substrate 210, a blue light emitting diode package 212, a red light emitting diode package 214, and a green light emitting diode package 216. The blue light emitting diode package 212 and the green light emitting diode package 216 are the same as those described in the first exemplary embodiment, and the arrangement structure of the blue light emitting diode package 212, the red light emitting diode package 214, the green light emitting diode package 216 are also the same as those in the first exemplary embodiment, and thus, repeated descriptions thereof will be omitted.

The red light emitting diode package 214 includes a second blue light emitting diode chip 222a, a wavelength converter 250, a color filter 260, and a first wall 240.

The second blue light emitting diode chip 222a may be the same as the first blue light emitting diode chip 122 described in the first exemplary embodiment, while a size of the second blue light emitting diode chip 222a included in the red light emitting diode package 214 may be smaller than that of the first blue light emitting diode chip 222 included in the blue light emitting diode package 212, as shown in FIG. 4.

Although the size of the second blue light emitting diode chip 222a included in the red light emitting diode package 214 according to the illustrated exemplary embodiment is small, the structure thereof may be the same as that of the first blue light emitting diode chip 122 described in the first exemplary embodiment.

The wavelength converter 250 is disposed to cover an upper surface and side surfaces of the second blue light emitting diode chip 222a disposed on the substrate 210. The wavelength converter 250 may include one or more types of phosphors capable of wavelength-converting blue light or ultraviolet light incident on the wavelength converter 250 to emit red light to the outside. That is, the wavelength converter 250 may include one or more types of phosphors and a carrier, such as silicone that supports the one or more types of phosphors. If necessary, the wavelength converter 250 may be disposed as a compressed mixture of the one or more types of phosphors, glass beads, and the like. In this case, the wavelength converter 250 may include a nitride-based or a fluoride-based red phosphor.

The color filter 260 may be disposed to cover the wavelength converter 250. The color filter 260 is disposed to block light having a wavelength equal to or shorter than a certain wavelength from light emitted through the wavelength converter 250. In the illustrated exemplary embodiment, the color filter 260 may block blue light emitted from the second blue light emitting diode chip 222a.

The first wall 240 may be disposed to surround side surfaces of the color filter 260. The first wall 240 may contact the side surfaces of the color filter 260, and may include a material having low light loss and high reflectivity.

Accordingly, red light emitted from the second blue light emitting diode chip 222a may be emitted to the outside in an upward direction through the wavelength converter 150 and the color filter 160.

FIGS. 5A through 5F are views illustrating a method of manufacturing a light emitting diode package included in the light emitting diode unit according to the second exemplary embodiment of the present disclosure.

In the illustrated exemplary embodiment, a manufacturing method of the blue light emitting diode package 112 and the green light emitting diode package 116 is the same as that in the first exemplary embodiment, and thus, repeated descriptions thereof will be omitted. Hereinafter, a method of manufacturing the red light emitting diode package 114 will be exemplary described with reference to FIGS. 5A to 5F.

Figure 5A:
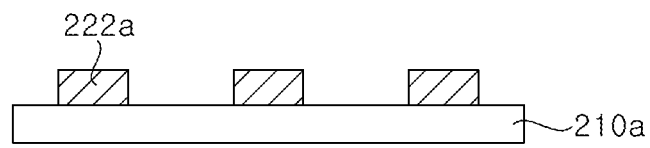
FIGS. 5A, 5B, 5C, 5D, 5E, and 5F are views illustrating a method of manufacturing a light emitting diode package included in the light emitting diode unit according to the second exemplary embodiment of the present disclosure.
Figure 5B:
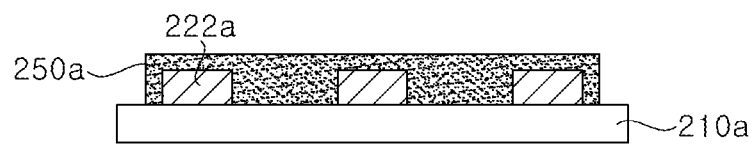
Figure 5C:
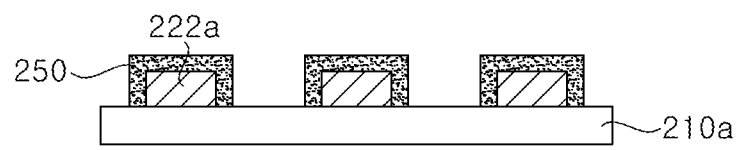

As shown in FIG. 5A, second blue light emitting diode chips 222a are disposed on the manufacturing substrate 210a at predetermined intervals. Then, as shown in FIG. 5B, a phosphor material 250a is applied to cover the entire second blue light emitting diode chip 222a. In this case, the phosphor material 250a may be silicone, epoxy, or the like.

After the applied phosphor material 250a is cured, each light emitting diode chip 222a is separated through a dicing process or the like, and the wavelength converter 250 is formed to cover each light emitting diode chip 222a. In this case, an upper portion of the wavelength converter 150 may be planarized through a grinding process, if necessary.

Figure 5D:
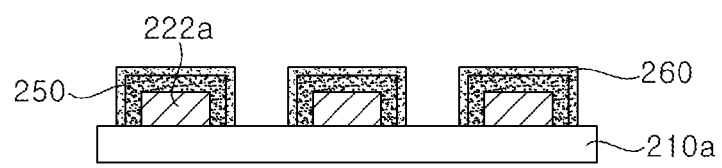

After the wavelength converter 250 is formed, the color filter 260 is coated as shown in FIG. 5D. The color filter 260 may be coated through a spin coating process, for example. At this time, a thickness of the color filter 260 may be adjusted as needed, and the color filter 260 may be formed to cover side surfaces and an upper surface of the wavelength converter 250.

Figure 5E:
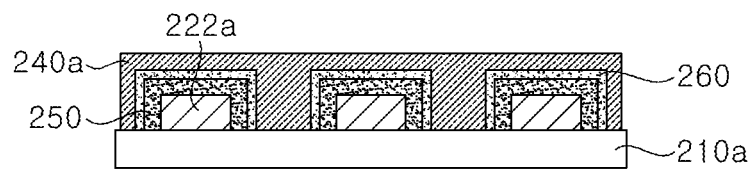
Figure 5F:
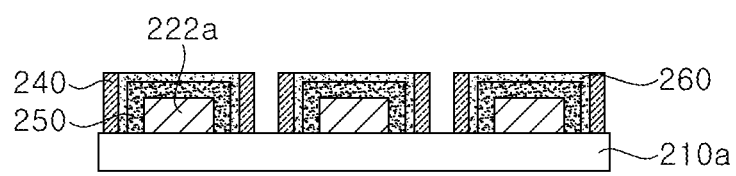

When the color filter 260 is formed, the wall material 240a for forming the first wall 240 is applied, as shown in FIG. 5E. The wall material 240a may be a material having low light loss and high reflectivity. When the wall material 240a is cured, each light emitting diode chip 222a may be separated through a dicing process, and the first wall 240 may be formed in accordance with an elevation of the color filter 260 by grinding the upper surface thereof, as shown FIG. 5F.

Figure 6A:
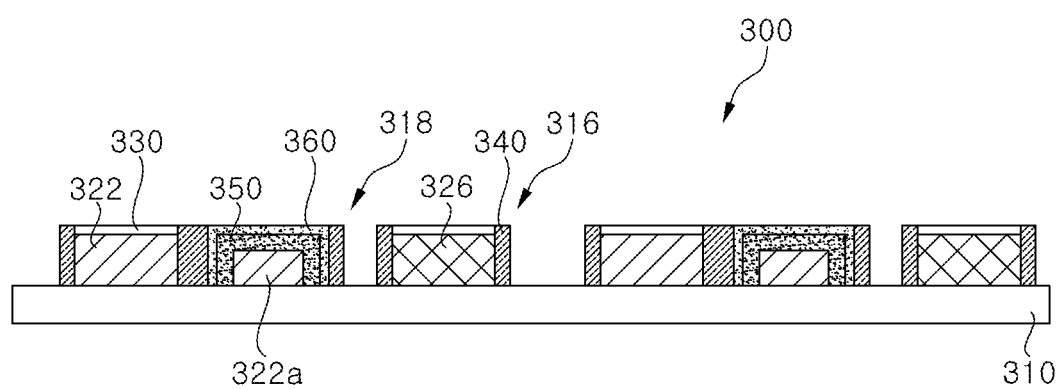
FIGS. 6A and 6B are a cross-sectional view and a plan view of a light emitting diode unit according to a third exemplary embodiment of the present disclosure.
Figure 6B:
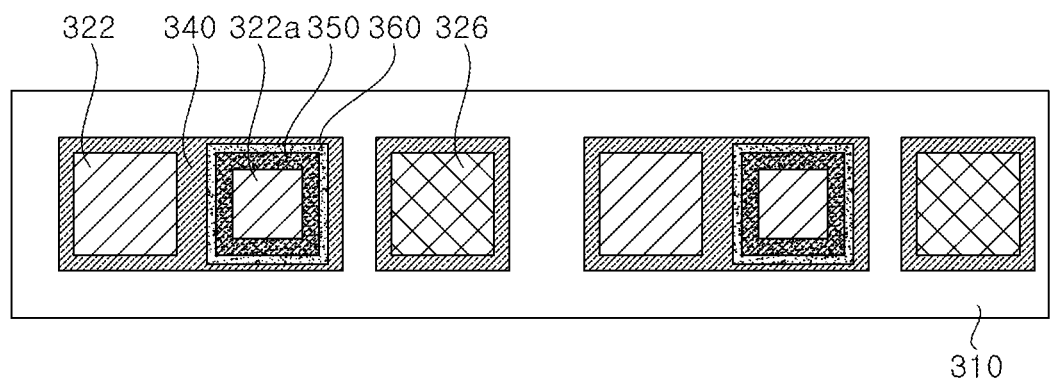

FIG. 6A and FIG. 6B are a cross-sectional view and a plan view illustrating a light emitting diode unit according to a third exemplary embodiment of the present disclosure.

Referring to FIG. 6A and FIG. 6B, a light emitting diode unit 300 according to the third exemplary embodiment of the present disclosure includes the green light emitting diode package 316 and a mixed light emitting diode package 318. The green light emitting diode package 316 and the mixed light emitting diode package 318 are disposed on the substrate 310, and are spaced apart from each other. The green light emitting diode package 316 is the same as that in the first exemplary embodiment, and thus, repeated descriptions thereof will be omitted.

In the mixed light emitting diode package 318, the blue light emitting diode package and the red light emitting diode package are formed as one package, and the first wall 340 is shared with each other. That is, the first blue light emitting diode chip 322 is disposed on one side, and the transparent portion 330 is disposed over the first blue light emitting diode chip 122.

The second blue light emitting diode chip 322a having a smaller size is spaced apart from the first blue light emitting diode chip 322, the wavelength converter 350 is disposed to cover the second blue light emitting diode chip 322a, and the color filter 360 is disposed to cover the wavelength converter 350. The first wall 340 is disposed to surround a space between the first blue light emitting diode chip 322 and the color filter 360 and side surfaces of the first blue light emitting diode chip 322 and the color filter 360.

Since the blue light emitting diode package emitting blue light to the outside and the red light emitting diode package emitting red light to the outside are disposed as one mixed light emitting diode package 318, the number of process steps for mounting the light emitting diode packages 316 and 318 may be reduced, and thus the process time may be reduced.

Figure 7A:
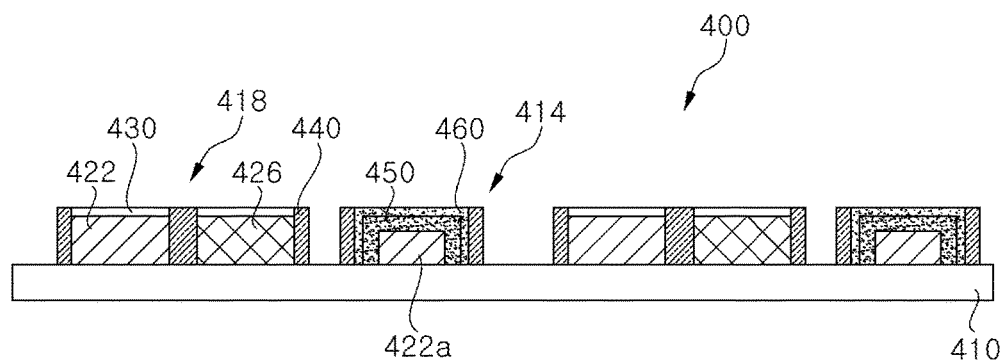
FIGS. 7A and 7B are a cross-sectional view and a plan view of a light emitting diode unit according to a fourth exemplary embodiment of the present disclosure.
Figure 7B:
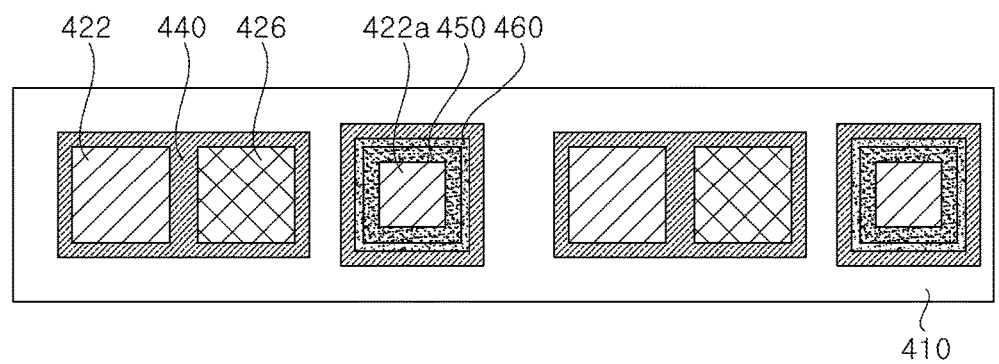

FIG. 7A and FIG. 7B are a cross-sectional view and a plan view illustrating a light emitting diode unit according to a fourth exemplary embodiment of the present disclosure.

Referring to FIG. 7A and FIG. 7B, a light emitting diode unit 400 according to the third exemplary embodiment of the present disclosure includes the red light emitting diode package 414 and a mixed light emitting diode package 418. The red light emitting diode package 414 and the mixed light emitting diode package 418 are disposed on the substrate 410, and are spaced apart from each other. The red light emitting diode package 414 is the same as that in the second exemplary embodiment, and thus, repeated descriptions thereof will be omitted.

In the illustrated exemplary embodiment, the blue light emitting diode package and the green light emitting diode package are formed in one package as the mixed light emitting diode package 414, and the first wall 440 is shared with each other. That is, the first blue light emitting diode chip 422 is disposed on one side, and the green light emitting diode chip 426 is spaced apart from the first blue light emitting diode chip 422.

The transparent portion 430 is disposed over the first blue light emitting diode chip 422 and the green light emitting diode chip 426, respectively, and the first wall 440 is disposed to surround a space between the first blue light emitting diode chip 422 and the green light emitting diode chip 426 and side surfaces of the first blue light emitting diode chip 422 and the green light emitting diode chip 426.

Since the blue light emitting diode package emitting blue light to the outside and the green light emitting diode chip emitting green light to the outside are formed as one mixed light emitting diode package 418, the number of process steps for mounting the blue and green light emitting diode packages may be reduced, and thus the process time may be reduced.

Figure 8:
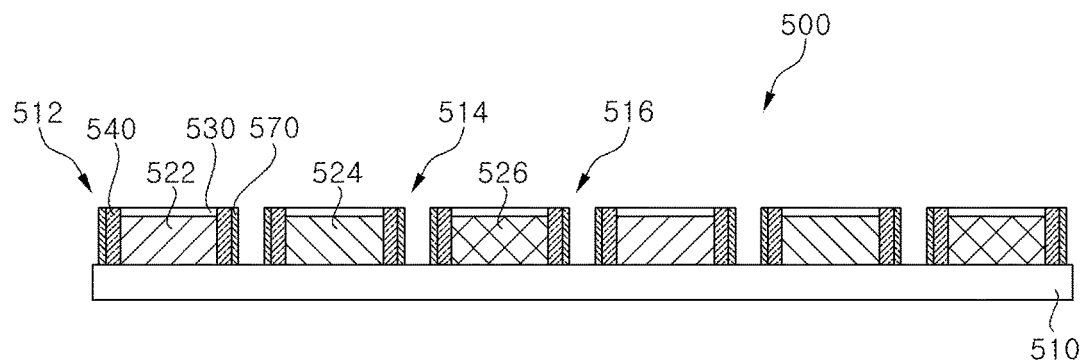
FIG. 8 is a cross-sectional view of a light emitting diode unit according to a fifth exemplary embodiment of the present disclosure.

FIG. 8 is a cross-sectional view illustrating a light emitting diode unit according to a fifth exemplary embodiment of the present disclosure.

A light emitting diode unit 500 according to the fifth exemplary embodiment of the present disclosure includes the substrate 510, a blue light emitting diode package 512, a red light emitting diode package 514, and a green light emitting diode package 516. The blue light emitting diode package 512, the red light emitting diode package 514, and the green light emitting diode package 516 are disposed on the substrate 510 and spaced apart from one another.

In the illustrated exemplary embodiment, the blue light emitting diode package 512 includes a first blue light emitting diode chip 522, a transparent portion 530, a first wall 540 and a second wall 570. The green light emitting diode package 516 includes a green light emitting diode chip 526, a transparent portion 530, the first wall 540, and the second wall 570. The red light emitting diode package 514 includes a red light emitting diode chip 524, a transparent portion 530, the first wall 540, and the second wall 570.

Each of the blue light emitting diode package 512, the red light emitting diode package 514, and the green light emitting diode package 516 has the same structure. As such, hereinafter, the structure of the blue light emitting diode package 512 will be exemplarily described.

The blue light emitting diode package 512 includes the first blue light emitting diode chip 522 disposed on the substrate 510, and the transparent portion 530 is disposed on an upper portion thereof. The first wall 540 is disposed to surround side surfaces of the first blue light emitting diode chip 522 and the transparent portion 530. In addition, the second wall 570 is disposed to surround the first wall 540. The first blue light emitting diode chip 522, the transparent portion 530, and the first wall 540 are the same as those in the first exemplary embodiment, and thus, repeated descriptions thereof will be omitted.

The second wall 570 may be disposed on an outer side of the first wall 540, and may be formed in black. As the black second wall 570 is disposed, contrast of light emitted from each light emitting diode package may be improved.

Figure 9:
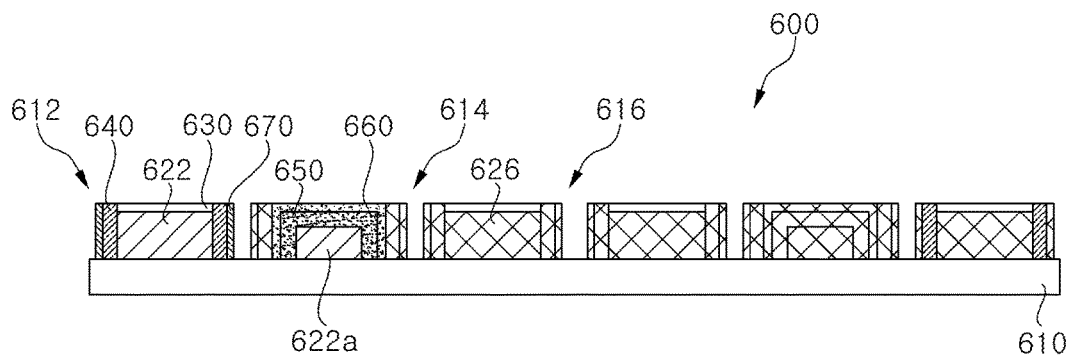
FIG. 9 is a cross-sectional view of a light emitting diode unit according to a sixth exemplary embodiment of the present disclosure.

FIG. 9 is a cross-sectional view illustrating a light emitting diode unit according to a sixth exemplary embodiment of the present disclosure.

Referring to FIG. 9, a light emitting diode unit 600 according to the sixth exemplary embodiment of the present disclosure includes the substrate 610, a blue light emitting diode package 612, a red light emitting diode package 614, and a green light emitting diode package 616.

In the illustrated exemplary embodiment, the blue light emitting diode package 612 and the green light emitting diode package 616 are the same as those in the fifth exemplary embodiment, and thus, repeated descriptions thereof will be omitted.

The red light emitting diode package 614 includes a second blue light emitting diode chip 622a, a wavelength converter 650, a color filter 660, a first wall 640, and a second wall 670. The second blue light emitting diode chip 622a, the wavelength converter 650, the color filter 660, and the first wall 640 are the same as those described in the second exemplary embodiment. The second wall 670 is disposed on an outer side of the first wall 640 to surround the first wall 640. As the black second wall 670 is disposed, contrast of light emitted from each light emitting diode package may be improved.

Figure 10:
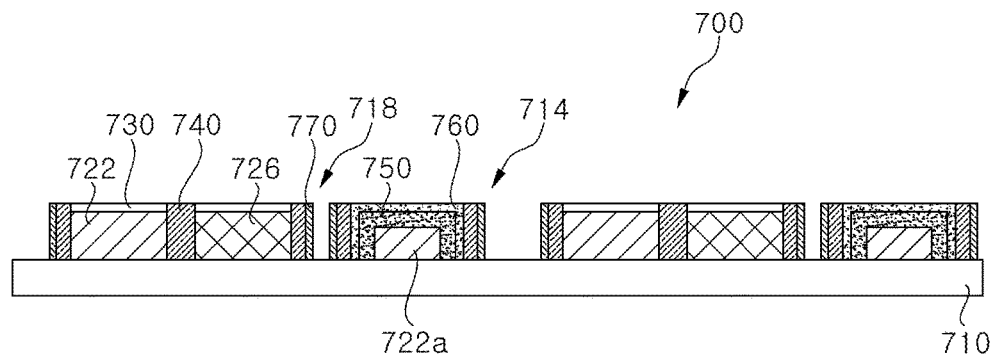
FIG. 10 is a cross-sectional view of a light emitting diode unit according to a seventh exemplary embodiment of the present disclosure.

FIG. 10 is a cross-sectional view illustrating a light emitting diode unit according to a seventh exemplary embodiment of the present disclosure.

Referring to FIG. 10, a light emitting diode unit 700 according to the seventh exemplary embodiment of the present disclosure includes a substrate 710, a red light emitting diode package 714 and a mixed light emitting diode package 718. The red light emitting diode package 714 and the mixed light emitting diode packages 718 are spaced apart from each other.

Since the red light emitting diode package 714 is the same as that in the sixth exemplary embodiment, repeated descriptions thereof will be omitted.

The mixed light emitting diode package 718 includes a first blue light emitting diode chip 722, a green light emitting diode chip 726, a transparent portion 730, a first wall 740, and a second wall 770.

The first blue light emitting diode chip 722 and the green light emitting diode chip 726 are spaced apart from each other, and the transparent portion 730 is disposed over the first blue light emitting diode chip 722 and the green light emitting diode chip 726, respectively. The first wall 140 7s disposed to surround a space between the first blue light emitting diode chip 722 and the green light emitting diode chip 726 and side surfaces of the first blue light emitting diode chip 122 and the green light emitting diode chip 126. The second wall 770 is disposed to surround an outer side of the first wall 740. At this time, the first wall 740 of the mixed light emitting diode package 718 is the same as that in the fourth is exemplary embodiment, and the second wall 770 may include the same material as that described in the fifth exemplary embodiment.

Figure 11:
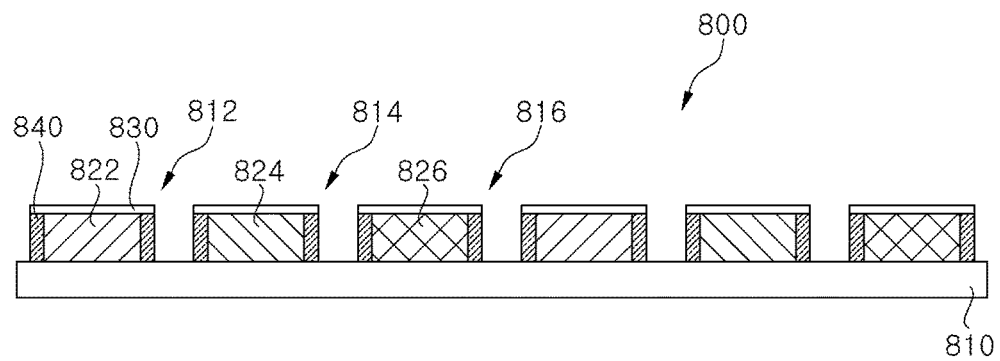
FIG. 11 is a cross-sectional view of a light emitting diode unit according to an eighth exemplary embodiment of the present disclosure.

FIG. 11 is a cross-sectional view illustrating a light emitting diode unit according to an eighth exemplary embodiment of the present disclosure.

Referring to FIG. 11, a light emitting diode unit 800 according to the eighth exemplary embodiment of the present disclosure includes a blue light emitting diode package 812, a red light emitting diode package 814, and a green light emitting diode package 816. The blue light emitting diode package 812, the red light emitting diode package 814, and the green light emitting diode package 816 are disposed on the substrate 810 and are spaced apart from one another.

The blue light emitting diode package 812 includes a first blue light emitting diode chip 822, a transparent portion 830, and a first wall 840. The red light emitting diode package 814 includes a red light emitting diode chip 824, the transparent portion 830, and the first wall 840. The green light emitting diode package 816 includes a green light emitting diode chip 826, the transparent portion 830, and the first wall 840. At this time, the blue light emitting diode package 812, the red light emitting diode package 814, and the green light emitting diode package 816 may have the same structure as each other. As such, hereinafter, the blue light emitting diode package 112 will be exemplarily described.

As shown in FIG. 11, the blue light emitting diode package 812 includes the first blue light emitting diode chip 822 disposed on the substrate 810, and the first wall 840 is disposed to surround side surfaces of the first blue light emitting diode chip 822. In this case, the first wall 840 may be disposed to have the same elevation as that of the first blue light emitting diode chip 822.

The transparent portion 830 may be disposed to cover upper portions of the first blue light emitting diode chip 822 and the first wall 840.

Figure 12:
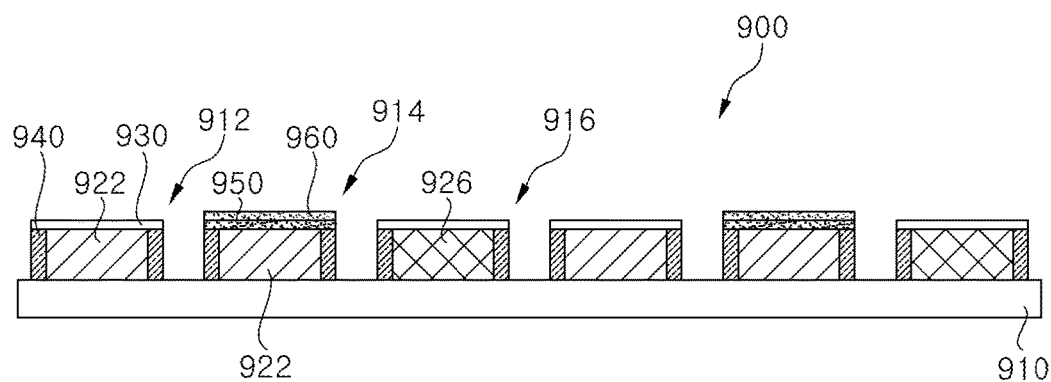
FIG. 12 is a cross-sectional view of a light emitting diode unit according to a ninth exemplary embodiment of the present disclosure.

FIG. 12 is a cross-sectional view of a light emitting diode unit according to a ninth embodiment of the present disclosure.

Referring to FIG. 12, a light emitting diode unit 900 according to the ninth exemplary embodiment of the present disclosure includes a blue light emitting diode package 912, a red light emitting diode package 914, and a green light emitting diode package 916. The blue light emitting diode package 912, the red light emitting diode package 914, and the green light emitting diode package 916 may be disposed on a substrate 910, and are spaced apart from one another.

In the illustrated exemplary embodiment, the blue light emitting diode package 912 and the green light emitting diode package 916 are the same as those in the eighth exemplary embodiment, and thus, repeated descriptions thereof will be omitted.

The red light emitting diode package 914 includes a first blue light emitting diode chip 922, a wavelength converter 950, a color filter 960, and a first wall 940. The first blue light emitting diode chip 922 is disposed on the substrate 910, and the first wall 940 is disposed to surround side surfaces of the first blue light emitting diode chip 922. In this case, the first wall 940 may be disposed to have the same elevation as that of the first blue light emitting diode chip 922. The wavelength converter 950 is disposed to cover upper portions of the first blue light emitting diode chip 922 and the first wall 940. The wavelength converter 950, as in the previous exemplary embodiments, may wavelength-convert blue light emitted from the first blue light emitting diode chip 922 to emit red light to the outside.

The color filter 960 may be disposed to cover the entire upper portion of the wavelength converter 950. The color filter 960 is provided to block blue light emitted through the wavelength converter 150 as in the previous exemplary embodiment.

Figure 13:
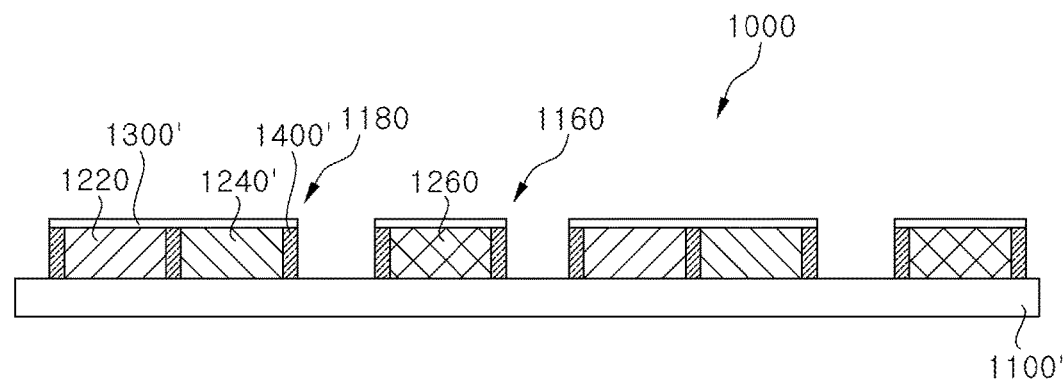
FIG. 13 is a cross-sectional view of a light emitting diode unit according to a tenth exemplary embodiment of the present disclosure.

FIG. 13 is a cross-sectional view illustrating a light emitting diode unit according to a tenth exemplary embodiment of the present disclosure.

Referring to FIG. 13, a light emitting diode unit 1000 according to the tenth exemplary embodiment of the present disclosure includes a green light emitting diode package 1160 and a mixed light emitting diode package 1180. The green light emitting diode package 1160 is the same as that in the eighth exemplary embodiment, and thus, repeated descriptions thereof will be omitted.

The mixed light emitting diode package 1180 includes a blue light emitting diode package, a red light emitting diode package, a transparent portion 1300', and a first wall 1400'. The first blue light emitting diode chip 1220 and the red light emitting diode chip 1240' are disposed on the substrate 1100', and are spaced apart from each other. The first wall 1400' is disposed to surround a space between the first blue light emitting diode chip 1220 and the red light emitting diode chip 1240' and side surfaces of the first blue light emitting diode chip 1220 and the red light emitting diode chip 1240'. In this case, the first wall 1400' may be disposed to have the same elevation as those of the first blue light emitting diode chip 1220 and the red light emitting diode chip 1240'.

The transparent portion 1300' is disposed to cover upper surfaces of the first blue light emitting diode chip 1220, the red light emitting diode chip 1240', and the first wall 1400'.

Figure 14:
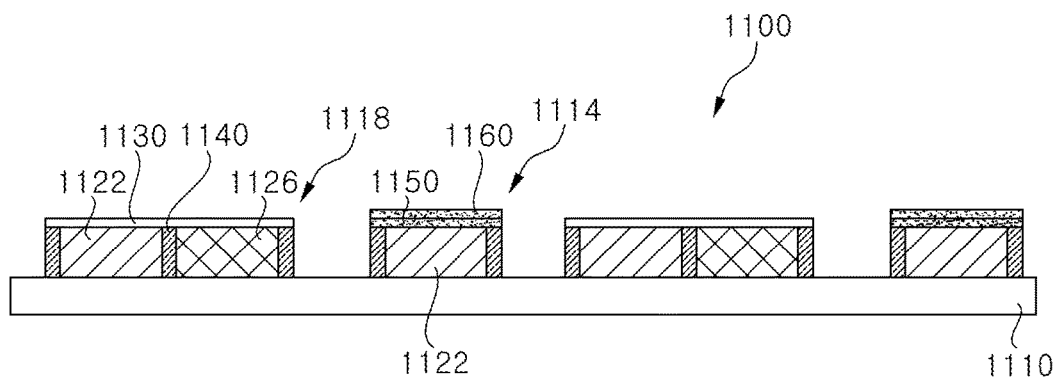
FIG. 14 is a cross-sectional view of a light emitting diode unit according to an eleventh exemplary embodiment of the present disclosure.

FIG. 14 is a cross-sectional view illustrating a light emitting diode unit according to an eleventh exemplary embodiment of the present disclosure.

Referring to FIG. 14, a light emitting diode unit 1100 according to the eleventh exemplary embodiment of the present disclosure includes a red light emitting diode package 1114 and a mixed light emitting diode package 1118, and the red light emitting diode package 1114 and the mixed light emitting diode package 1118 are spaced apart from each other.

In the illustrated exemplary embodiment, the red light emitting diode package 1114 is the same as that in the ninth exemplary embodiment, and thus, repeated descriptions thereof will be omitted.

The mixed light emitting diode package 1118 includes a blue light emitting diode package, a green light emitting diode package, a transparent portion 130, and a first wall 140. The first blue light emitting diode chip 1122 and the green light emitting diode chip 1126 are disposed on the substrate 1110, and are spaced apart from each other. The first wall 1140 is disposed to surround a space between the first blue light emitting diode chip 1122 and the green light emitting diode chip 1126 and side surfaces of the first blue light emitting diode chip 1122 and the green light emitting diode chip 1126. In this case, the first wall 1140 may be disposed to have the same elevation as those of the first blue light emitting diode chip 1122 and the green light emitting diode chip 1126.

The transparent portion 1130 is disposed to cover upper surfaces of the first blue light emitting diode chip 1122, the green light emitting diode chip 1126, and the first wall 1140.

Figure 15:
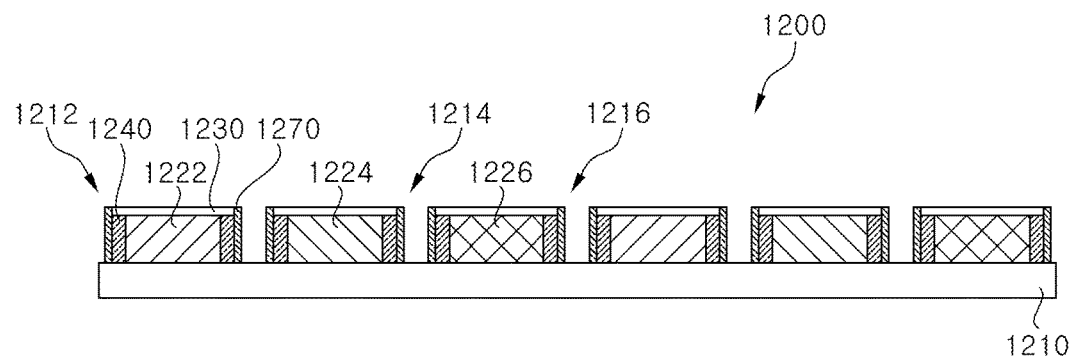
FIG. 15 is a cross-sectional view of a light emitting diode unit according to a twelfth exemplary embodiment of the present disclosure.

FIG. 15 is a cross-sectional view illustrating a light emitting diode unit according to a twelfth exemplary embodiment of the present disclosure.

Referring to FIG. 15, a light emitting diode unit 1200 according to the twelfth exemplary embodiment of the present disclosure includes a blue light emitting diode package 1212, a red light emitting diode package 1214, and a green light emitting diode package 1216. The blue light emitting diode package 1212, the red light emitting diode package 1214, and the green light emitting diode package 1216 are disposed on the substrate 1210, and are spaced apart from one another.

The blue light emitting diode package 1212 includes a first blue light emitting diode chip 1222, a transparent portion 1230, a first wall 1240, and a second wall 1270. The red light emitting diode package 1214 includes a red light emitting diode chip 1224, the transparent portion 1230, the first wall 1240, and the second wall 1270. The green light emitting diode package 1216 includes a green light emitting diode chip 1226, the transparent portion 1230, the first wall 1240, and the second wall 1270. In this case, the blue light emitting diode package 1212, the red light emitting diode package 1214, and the green light emitting diode package 1216 may have the same structure as each other. As such, hereinafter the blue light emitting diode package 112 will be exemplarily described.

As shown in FIG. 11, the blue light emitting diode package 1212 includes the first blue light emitting diode chip 1222 disposed on the substrate 1210, and the first wall 1240 is disposed to surround side surfaces of the first blue light emitting diode chip 1222. In this case, the first wall 1240 may be disposed to have the same elevation as that of the first blue light emitting diode chip 1222. In addition, the transparent portion 1230 may be disposed to cover upper portions of the first blue light emitting diode chip 1222 and the first wall 1240.

Further, the second wall 1270 is disposed to surround the transparent portion 1230 and side surfaces of the first wall 1240 on which the transparent portion 1230 is formed. In this case, the second wall 1270 is the same as that described in the previous exemplary embodiment, and may have the same elevation as that of the upper surface of the transparent portion 1230.

Figure 16:
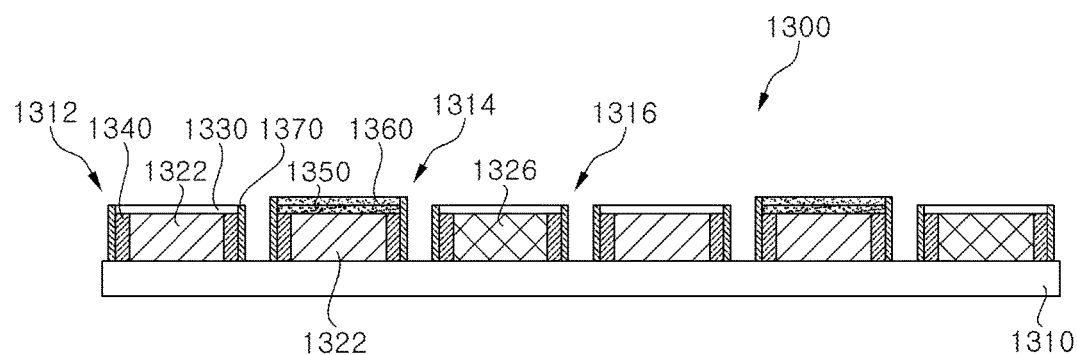
FIG. 16 is a cross-sectional view illustrating a light emitting diode unit according to a thirteenth exemplary embodiment of the present disclosure.

FIG. 16 is a cross-sectional view illustrating a light emitting diode unit according to a thirteenth exemplary embodiment of the present disclosure.

Referring to FIG. 16, a light emitting diode unit 1300 according to the thirteenth exemplary embodiment of the present disclosure includes a blue light emitting diode package 1312, a red light emitting diode package 1314, and a green light emitting diode package 1316. The blue light emitting diode package 1312, the red light emitting diode package 1314, and the green light emitting diode package 1316 may be disposed on the substrate 1310, and are spaced apart from one another.

In the illustrated exemplary embodiment, the blue light emitting diode package 1312 and the green light emitting diode package 1316 are the same as those in the twelfth exemplary embodiment, and thus, repeated descriptions thereof will be omitted.

The red light emitting diode package 1314 includes a first blue light emitting diode chip 1322, a wavelength converter 1350, a color filter 1360, a first wall 1340, and a second wall 1370. The first blue light emitting diode chip 1322 is disposed on the substrate 1310, and the first wall 1340 is disposed to surround side surfaces of the first blue light emitting diode chip 1322. In this case, the first wall 1340 may be disposed to have the same elevation as that of the first blue light emitting diode chip 1232. The wavelength converter 1350 is disposed to cover upper portions of the first blue light emitting diode chip 1322 and the first wall 1340. The wavelength converter 1350, as in other exemplary embodiments, may wavelength-convert blue light emitted from the first blue light emitting diode chip 1322 to emit red light to the outside.

The color filter 1360 may be disposed to cover the entire upper portion of the wavelength converter 1350. The color filter 1360 is provided to block blue light emitted from the wavelength converter 1350 as in the previous exemplary embodiments. The second wall 1370 is disposed to surround side surfaces of the wavelength converter 1350, the color filter 1360, and the first wall 1340 on which the color filter 1360 is formed. In this case, the second wall 1370 may have the same elevation as that of the color filter 1360.

Figure 17:
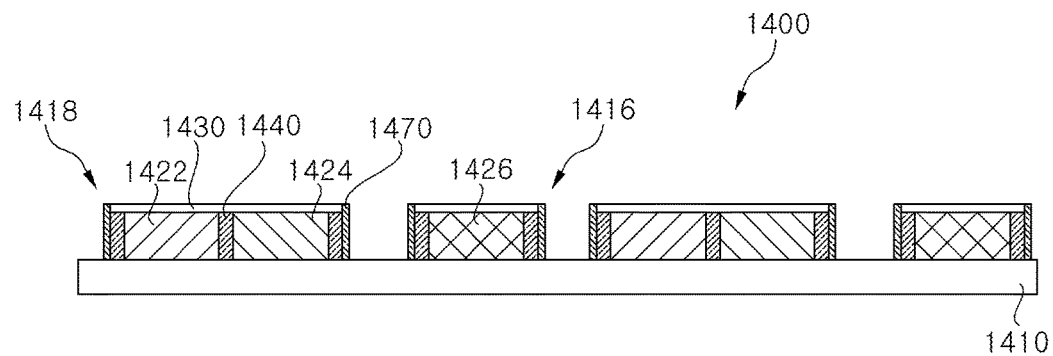
FIG. 17 is a cross-sectional view illustrating a light emitting diode unit according to a fourteenth exemplary embodiment of the present disclosure.

FIG. 17 is a cross-sectional view illustrating a light emitting diode unit according to a fourteenth exemplary embodiment of the present disclosure.

Referring to FIG. 17, a light emitting diode unit 1400 according to the fourteenth exemplary embodiment of the present disclosure includes a green light emitting diode package 1416 and a mixed light emitting diode package 1418. In this case, the green light emitting diode package 1416 is the same as that in the twelfth exemplary embodiment, and thus, repeated descriptions thereof will be omitted.

The mixed light emitting diode package 1418 includes a blue light emitting diode package, a red light emitting diode package, a transparent portion 1430, a first wall 1440, and a second wall 1470. The first blue light emitting diode chip 1422 and the red light emitting diode chip 1424 are disposed on the substrate 1410, and are spaced apart from each other. The first wall 1440 is disposed to surround a space between the first blue light emitting diode chip 1422 and the red light emitting diode chip 1424, and side surfaces of the first blue light emitting diode chip 1422 and the red light emitting diode chip 1424. In this case, the first wall 1440 may be disposed to have the same elevation as those of the first blue light emitting diode chip 1422 and the red light emitting diode chip 1424.

The transparent portion 1430 is disposed to cover upper surfaces of the first blue light emitting diode chip 1422, the red light emitting diode chip 1424, and the first wall 1440. In addition, the second wall 1470 may be disposed to surround side surfaces of the transparent portion 1430 and the first wall 1440, and the second wall 1470 may be disposed to have the same elevation as that of the transparent portion 1430.

Figure 18:
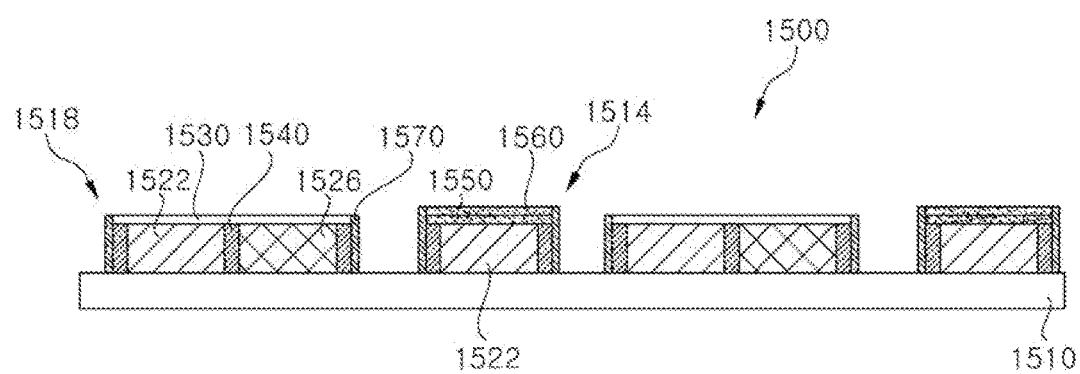
FIG. 18 is a cross-sectional view illustrating a light emitting diode unit according to a fifteenth exemplary embodiment of the present disclosure.

FIG. 18 is a cross-sectional view illustrating a light emitting diode unit according to a fifteenth exemplary embodiment of the present disclosure.

Referring to FIG. 18, a light emitting diode unit 1500 according to the fifteenth exemplary embodiment of the present disclosure includes a red light emitting diode package 1514 and a mixed light emitting diode package 1518 spaced apart from each other.

In the illustrated exemplary embodiment, the red light emitting diode package 1514 is the same as that in the thirteenth exemplary embodiment, and thus, repeated descriptions thereof will be omitted.

The mixed light emitting diode package 1518 includes a blue light emitting diode package, a green light emitting diode package, a transparent portion 1530, a first wall 1540, and a second wall 1570. The first blue light emitting diode chip 1522 and the green light emitting diode chip 1526 are disposed on the substrate 1510, and are spaced apart from each other. The first wall 1540 is disposed to surround a space between the first blue light emitting diode chip 1522 and the green light emitting diode chip 1526, and side surfaces of the first blue light emitting diode chip 1522 and the green light emitting diode chip 1526. In this case, the first wall 1540 may be disposed to have the same elevation as those of the first blue light emitting diode chip 1522 and the green light emitting diode chip 1526.

The transparent portion 1530 is disposed to cover upper surfaces of the first blue light emitting diode chip 1522, the green light emitting diode chip 1526, and the first wall 1540. In addition, the second wall 1570 may be disposed to surround side surfaces of the transparent portion 1530 and the first wall 1540, and the second wall 1570 may be disposed to have the same elevation as that of the transparent portion 1530.

According to exemplary embodiments of the present disclosure, a wall is disposed on side surfaces of a light emitting diode chip included in each light emitting diode package, to minimize light emitted to the side surfaces of the light emitting diode package and being lost, thereby facilitating a mixture of light emitted from the light emitting diode packages into a desired color.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangement.

What is claimed is:

1. A light emitting diode device comprising:
a substrate;
a plurality of terminals disposed on the substrate; and
a plurality of light sources disposed on the substrate, electrically connected to the plurality of terminals, and configured to emit light, wherein the plurality of light sources include a first light source, a second light source, and a third light source,
wherein at least one of the light sources comprises:
a light emitting diode chip; and
a wall surrounding side surfaces of the light emitting diode chip,
wherein the at least one of the light sources includes a wavelength converter disposed on the light emitting diode chip,
wherein at least two light sources share a first wall,
wherein the plurality of light sources are arranged in one direction in an order of the first light source, the second light source, and the third light source, and a distance between the second light source and the first light source that share the first wall is less than a distance between the second light source and the third light source that do not share the first wall, and
wherein the wavelength converter covers side surfaces and an upper surface of the light emitting diode chip.

2. The light emitting diode device of claim 1, wherein the plurality of light sources are configured to emit light of different wavelengths.

3. The light emitting diode device of claim 2, wherein the wall has a height greater than that of the light emitting diode chip surrounded by the wall.

4. The light emitting diode device of claim 3, wherein side surfaces of the wavelength converter are surrounded by the wall.

5. The light emitting diode device of claim 4, wherein the at least one of the light sources includes a color filter disposed on the wall.

6. The light emitting diode device of claim 2, wherein:
a height of the wall is the same as that of the light emitting diode chip surrounded by the wall; and
the wavelength converter is disposed on the wall.

7. The light emitting diode device of claim 6, wherein:
the at least one of the light sources includes a color filter disposed on the wall; and
the color filter is spaced apart from the wall.

8. The light emitting diode device of claim 1, wherein the wavelength converter comprises one or more types of phosphors to convert wavelength of blue light or ultraviolet light.

9. The light emitting diode device of claim 8, wherein the wavelength converter further comprises a carrier supporting the one or more types of phosphors.

10. The light emitting diode device of claim 9, wherein the carrier comprises silicone.

11. The light emitting diode device of claim 1, wherein the at least one of the light sources further comprises a transparent layer disposed on the light emitting diode chip.

12. The light emitting diode device of claim 11, wherein the transparent layer comprises at least one of silicone and epoxy.

13. The light emitting diode device of claim 11, wherein the transparent layer is disposed between the light emitting diode chip and the wavelength converter.

14. The light emitting diode device of claim 1, wherein the wall is a black wall.

15. The light emitting diode device of claim 1, wherein the at least one of the light sources includes a color filter disposed on the wavelength converter.

16. A light emitting diode device comprising:
a substrate;
a plurality of terminals disposed on the substrate; and
a plurality of light sources disposed on the substrate, electrically connected to the plurality of terminals, and configured to emit light, wherein the plurality of light sources include a first light source, a second light source, and a third light source,
wherein at least one of the light sources comprises:
a light emitting diode chip; and
a first wall surrounding side surfaces of the light emitting diode chip,
wherein the at least one of the light sources includes a wavelength converter disposed on the light emitting diode chip,
wherein the first wall has a height greater than that of the light emitting diode chip,
wherein a second wall is disposed on an outer side of the first wall and surrounds a side surface of the first wall,
wherein at least two light sources share a wall, and
wherein the plurality of light sources is arranged in one direction in an order of the first light source, the second light source, and the third light source, and a distance between the second light source and the first light source that share the wall is less than a distance between the second light source and the third light source that do not share the wall.

17. The light emitting diode device of claim 16, further comprising a color filter disposed on the wavelength converter.

18. The light emitting diode device of claim 17, wherein an upper surface of the first wall and an upper surface of the wavelength converter are disposed on a same plane.

19. The light emitting diode device of claim 18, wherein the color filter is disposed on the upper surface of the first wall.

* * * * *